United States Patent [19]
Walkup et al.

[11] Patent Number: 6,071,138
[45] Date of Patent: Jun. 6, 2000

[54] DRIVING MECHANISM OF A ZIF PGA SOCKET AND THE SOCKET USING THE SAME

[75] Inventors: William B. Walkup, Hillsboro, Oreg.; Wen-Chun Pei, Taipei; Yao-Chi Huang, Yung-Ho, both of Taiwan

[73] Assignee: Hon Hai Precision Ind. Co., Ltd., Taipei Hsien, Taiwan

[21] Appl. No.: 09/218,106

[22] Filed: Dec. 21, 1998

[51] Int. Cl.[7] .............................. H01R 11/22; H01R 4/50; H01R 13/625
[52] U.S. Cl. ............................................................. 439/266
[58] Field of Search .................................... 439/266, 342, 439/259, 268

[56] References Cited

U.S. PATENT DOCUMENTS

| | | | |
|---|---|---|---|
| 5,679,020 | 10/1997 | Lai et al. | 439/342 |
| 5,721,673 | 2/1998 | Klein | 361/809 |
| 5,730,615 | 3/1998 | Lai et al. | 439/342 |
| 5,883,790 | 3/1999 | Klein | 361/809 |
| 5,989,049 | 11/1999 | Walkup et al. | 439/342 |
| 6,004,152 | 12/1999 | Walkup et al. | 439/342 |

*Primary Examiner*—Neil Abrams
*Assistant Examiner*—Chandrika Prasad
*Attorney, Agent, or Firm*—Wei Te Chung

[57] ABSTRACT

A ZIF PGA socket includes a first housing and two second housings slidably received in the first housing. The second housings are simultaneously moved in the first housing by an actuator rod which is driven by a cam lever. The direction of movement of the second housing is substantially perpendicular to the direction of movement of the actuator rod.

18 Claims, 15 Drawing Sheets

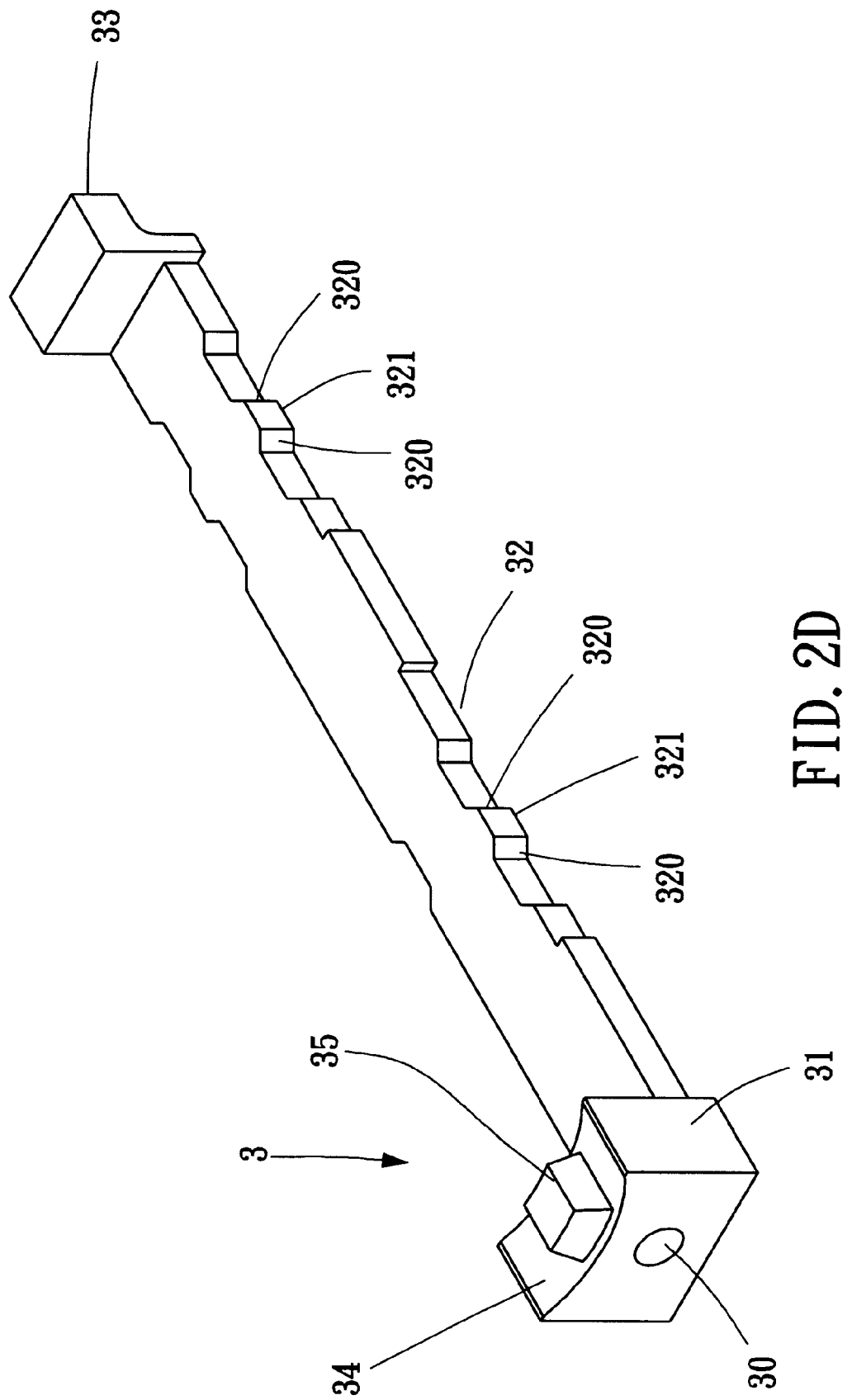
FID. 2D

DRIVING MECHANISM OF A ZIF PGA SOCKET AND THE SOCKET USING THE SAME

BACKGROUND OF THE INVENTION

1. Field of the Invention

The present invention relates to a socket for a CPU module, and especially to a two-layer ZIF PGA socket whereby a related CPU module may be mounted thereto with zero insertion force and the ZIF PGA socket may be operated to electrically connect with the CPU module without moving the CPU module in a lateral direction.

2. The Prior Art

Conventional ZIF PGA sockets normally comprise a cover defining a plurality of upper passageways therein and slidably engaging with a base which defines a corresponding number of lower passageways retaining contacts therein. The upper passageways and the lower passageways are in constant communication with each other. A cam is received in a space defined between the cover and the base and operative to move the cover along the base thereby positioning the socket at either a loosened status ready for insertion of pins of the CPU or a tightened status forcing the pins of the CPU to abut against the corresponding contacts. When the socket is in the loosened status, the pins of the CPU are inserted into the upper passageways and the lower passageways with a substantially zero insertion force, but are not in electrical contact with the contacts retained in the lower passageways. The cam is then operated to drive the cover to move laterally along the base thereby urging the pins of the CPU module to electrically connect with the contacts of the base. The CPU module is moved by the cover of the socket when the socket is changed from the loosened status to the tightened status.

The CPU module is commonly engaged with a heat sink for heat dissipation. However, due to the high density of modularization, the CPU module is heavy and has a large dimension. Thus, the addition of the heat sink causes the assembly of the CPU module and the heat sink to be larger and heavier whereby operation of the cam to laterally move the CPU module is laborious.

To solve the problem, U.S. patent application Ser. No. 09/138,188, which is assigned to the same assignee as the present invention, discloses a three-layer ZIF socket comprising an upper layer defining a plurality of first passageways for receiving CPU pins when the CPU rests thereon, a lower layer defining a plurality of second passageways for receiving soldering tails therein, and a middle layer movably retained between the upper and lower layers and defining a plurality of third passageways for receiving bridging terminals therein. Each soldering tail has a lower portion soldered on a printed circuit board and an upper portion extends into the corresponding third passageway. The upper and middle layers are dimensioned so that the CPU pin is positioned in the first and third passageways. The bridging terminal is movable by the middle layer to be selectively displaced between a first position where the soldering tail and the CPU pin are not connected, and a second position where the soldering tail and the CPU pin are electrically connected by the bridging terminal. In such a three-layer socket, the CPU pins remain stationary yet can still electrically connect with the printed circuit board via movement of the middle layer. However, the middle layer is apt to warp after manufacture due to its large area thereby adversely affecting the movement between the upper and bottom layers. Moreover, such a three-layer structure requires two kinds of terminals (soldering tails and bridging terminals) which increases manufacturing costs. Additionally, the profile of the three-layer socket is higher compared to the two-layer socket and violates the miniaturization trend of the computer industry.

Hence, it is requisite to provide a low profile ZIF socket which does not move the CPU module laterally when the CPU module is changed between the tightened status and the loosened status.

SUMMARY OF THE INVENTION

The primary purpose of the present invention is to provide a driving mechanism of a ZIF PGA socket which utilizes a cam lever cooperating with an actuator rod in order to move two piece housing slidably received in a main housing.

The second purpose of the present invention is to provide a ZIF PGA socket which utilizes a driving mechanism to move two piece housing slidably received in a main housing.

To fulfill the primary purpose, a driving mechanism is provided for a ZIF PGA socket which comprises a main housing slidably receiving two second housings therein. The driving mechanism comprises a cam lever comprising a cam and a handle bar connected to the cam. The cam is disk-shaped having opposite flat surfaces and a curved surface connected between the flat surfaces and defining an elongate recess in the curved surface. An actuator rod comprises a follower body connected to a rod which is movably engaged with the two second housings. The follower body has a concave upper surface on which a curved block is formed to be slidably received in the elongate recess of the cam. When the cam lever is rotated, the curved block of the actuator rod is moved along the elongate recess thus causing the rod to move in a direction parallel to an axial direction of the disk-shaped cam.

To fulfill the second purpose, a ZIF PGA socket comprises a first housing defining two recesses for slidably receiving two second housings therein and comprising guiding channel means external to the recesses and comprising a receptacle. A follower portion extends from the second housing external to the recess of the first housing and aligns with the guiding channel means. A cam lever comprises a disk-shaped cam and a handle bar connected to the disk-shaped cam which has opposite flat surfaces and a curved surface defining an elongate recess therein and connected between the flat surfaces. The cam is rotatably received in the receptacle of the guiding channel means. An actuator rod comprises a follower body connected to a rod which is movably engaged with the two second housings. The follower body is movably received in the receptacle and has a concave upper surface on which a curved block is formed to be slidably received in the elongate recess of the cam. When the cam is rotated by the handle bar, the curved block of the actuator rod is moved along the elongate recess thus causing the rod to move in a direction parallel to an axial direction of the disk-shaped cam.

BRIEF DESCRIPTION OF THE DRAWINGS

FIG. 2D is an enlarged perspective view of an actuator rod of the ZIF PGA socket;

DETAILED DESCRIPTION OF THE PREFERRED EMBODIMENT

Figure 1:
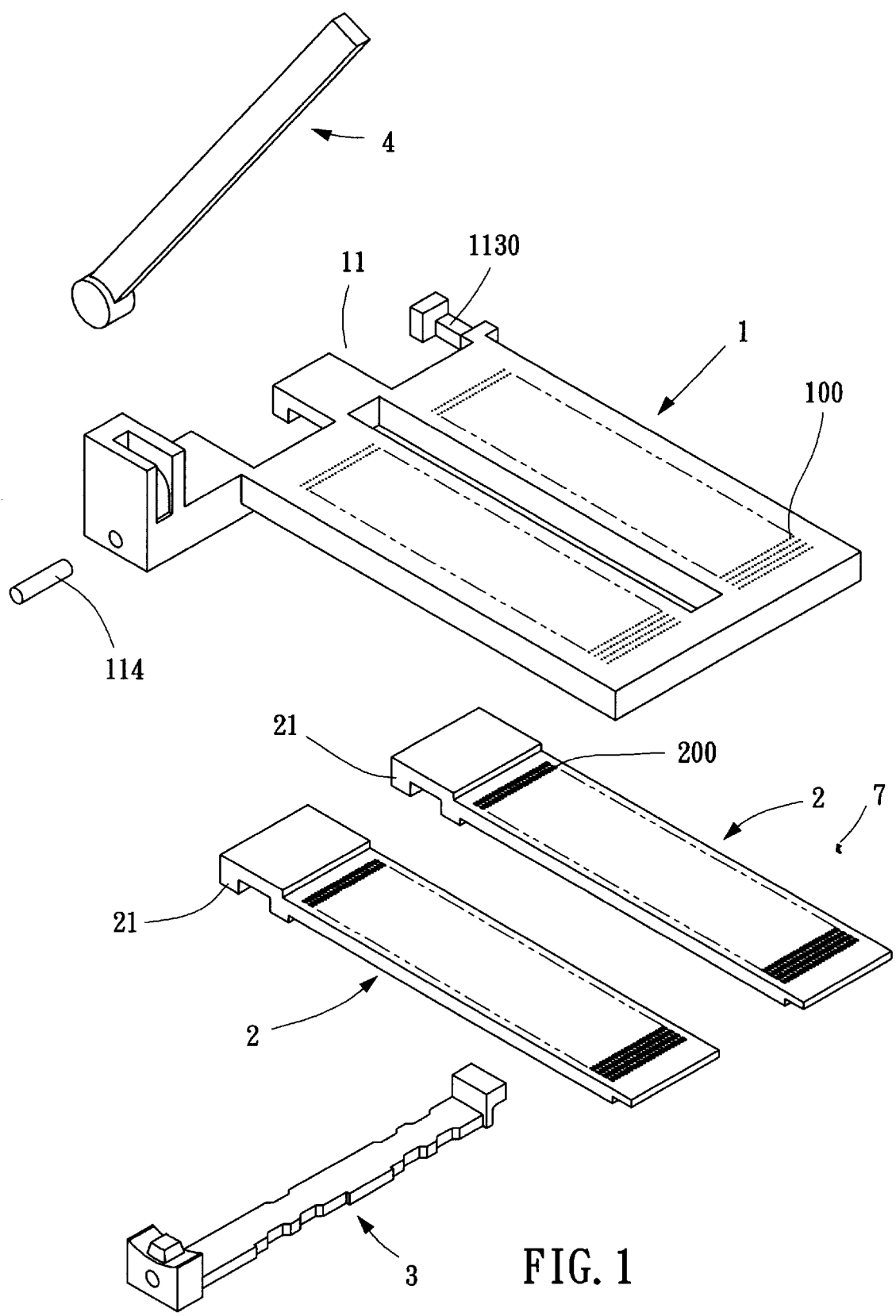
FIG. 1 is an exploded view of a ZIF PGA socket in accordance with the present invention.
Figure 2A:
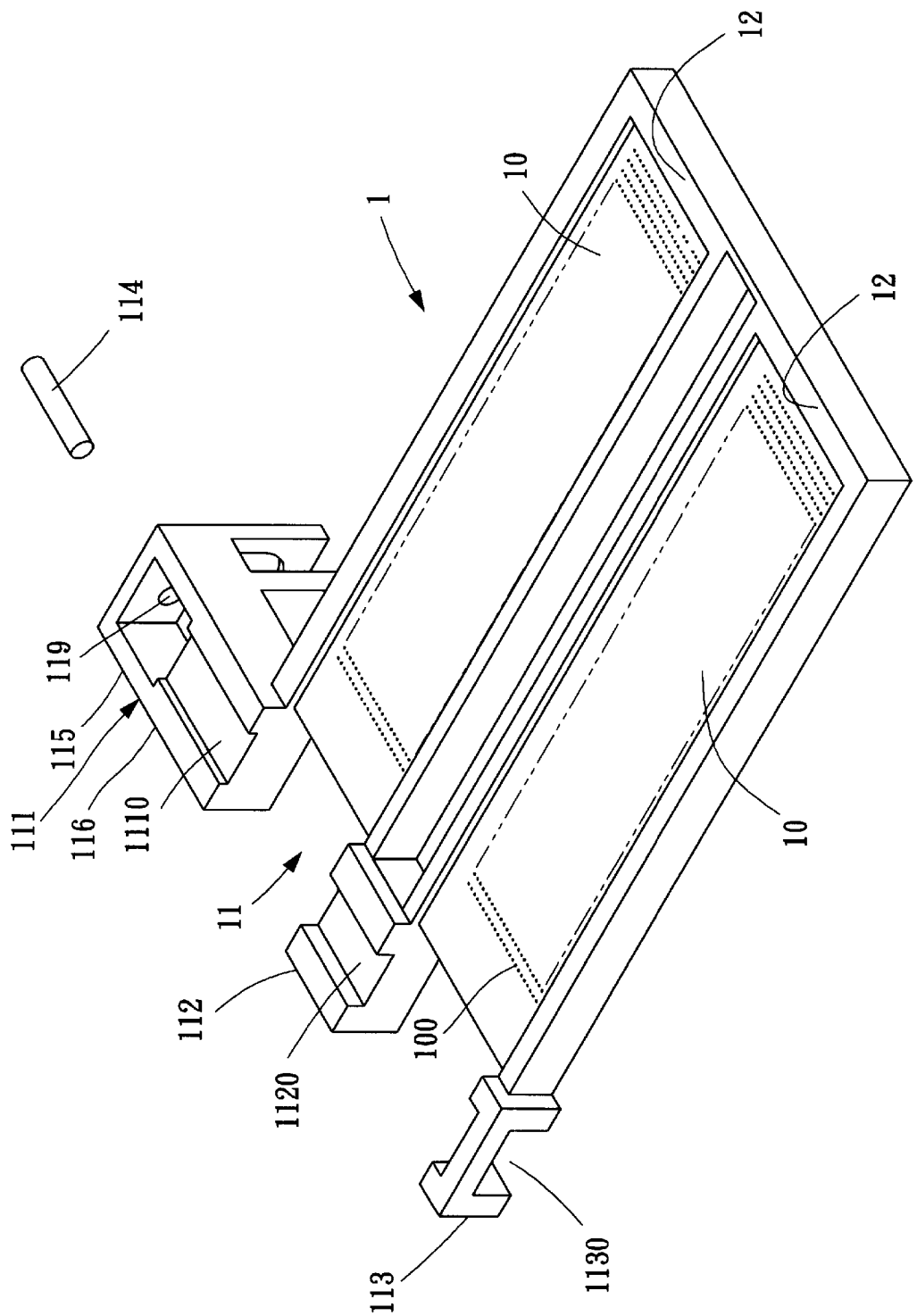
FIG. 2A is an enlarged perspective bottom view of a first housing of the ZIF PGA socket.
Figure 2B:
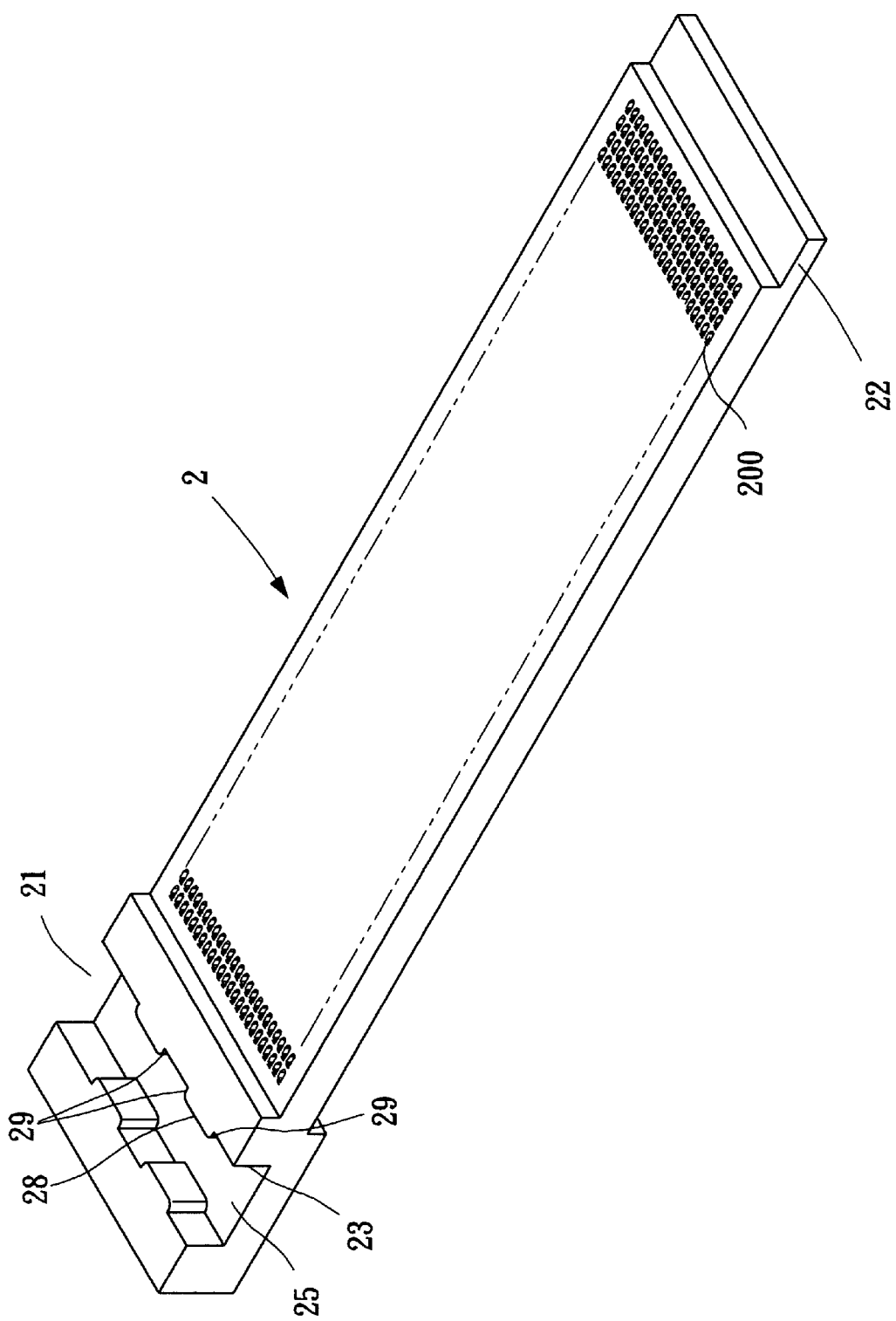
FIG. 2B is an enlarged perspective bottom view of a second housing of the ZIF PGA socket.

Referring to FIGS. 1, 2A and 2B, a ZIF PGA socket in accordance with the present invention comprises a first housing 1 defining a plurality of first passageways 100 for receiving pins of a CPU module (not shown) and two recesses 10 therein and having guiding channel means 11 extending from the first housing 1, two second housings 2 slidably received in the recesses 10 and each defining a plurality of second passageways 200 each aligned with the corresponding first passageway 100 and receiving a contact 7 therein and having a follower portion 21 extending out of the recess 10 and aligning with the guiding channel means 11, an actuator rod 3 slidably received in the guiding channel means 11 and remaining in contact with the follower portion 21 for moving the second housing 2 in a direction substantially perpendicular to a lengthwise direction of the guiding channel means 11, and a lever 4 pivotably engaged with a portion of the actuator rod 3 for moving the actuator rod 3 along the guiding channel means 11 which in turn moves the second housing 2 in a direction perpendicular to the lengthwise direction of the guiding channel means 11.

Particularly referring to FIG. 2A, each recess 10 defined in the first housing 1 has a flange 12 extending from a peripheral wall thereof. The guiding channel means 11 comprises a first guiding section 111, a second guiding section 112 and a third guiding section 113. The first guiding section 111 and the second guiding section 112 each define a channel 1110, 1120 in a bottom surface thereof and in alignment with each other. The third guiding section 113 defines a recess 1130 in a top surface thereof and in communication with the channels 1110, 1120. The first guiding section 111 comprises a receptacle 115 and a U-shaped portion 116 in communication with the receptacle 115. A supporting hole 119 is defined in a vertical wall of the receptacle 115 for receiving a plug 114.

Particularly referring to FIG. 2B, each second housing 2 has a stepped tail portion 22 dimensioned to slidably rest on the flange 12 of the first housing 1. The follower portion 21 of the second housing 2 forms two inner faces 23 opposite each other and defining a reception space 25 therebetween. Each inner face 23 has two protrusions 28 extending therefrom in a staggered arrangement. Each protrusion 28 has two tapered walls 29 formed on opposite sides thereof substantially along the lengthwise direction of the inner face 23.

Figure 2C:
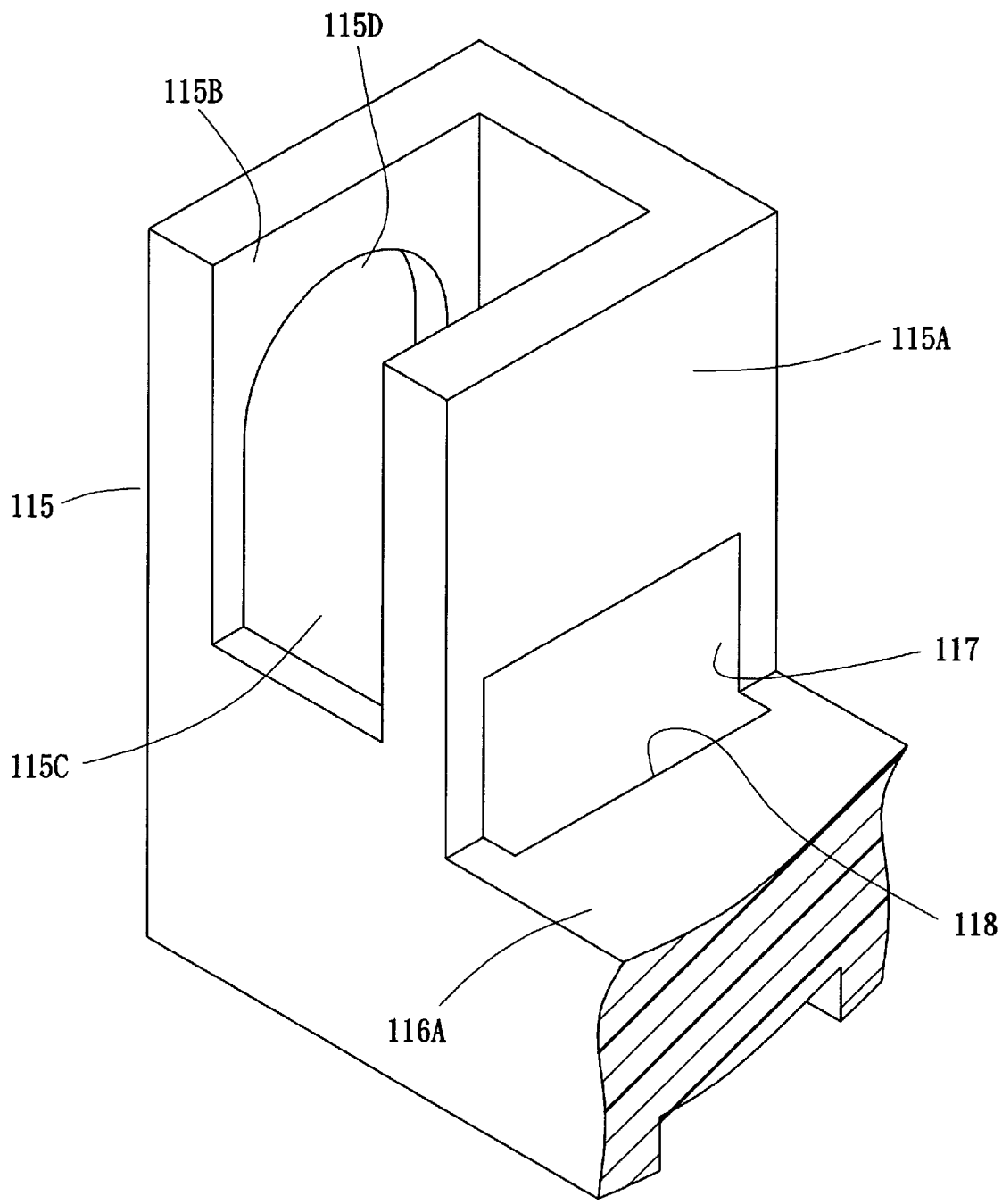
FIG. 2C is an enlarged perspective view of a socket of the first housing.

Referring to FIG. 2C, the receptacle 115 and the U-shaped portion 116 of the first guiding section 111 are respectively defined in a vertical wall 115A and a horizontal wall 116A thereof. Openings 117, 118 are respectively defined in the walls 115A, 116A and in communication with each other. Another vertical wall 115B which defines the supporting hole 119 is located opposite the vertical wall 115A thereby defining a reception space 115C therebetween for receiving a portion of the cam lever 4. Curved recesses 115D are defined in each inner surface of the vertical walls 115A, 115B for retaining a portion of the cam lever.

Figure 10A:
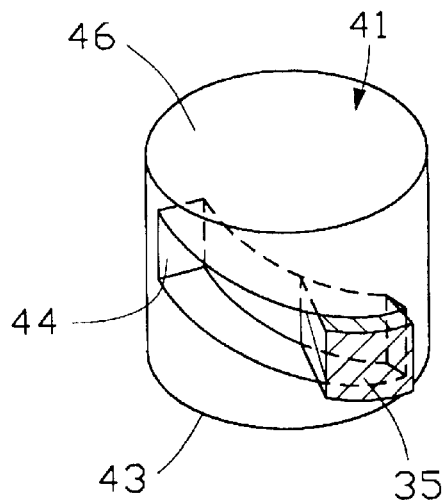
FIG. 10 is a schematic view showing the driving relationship between the actuator rod and the second housing.
Figure 10B:
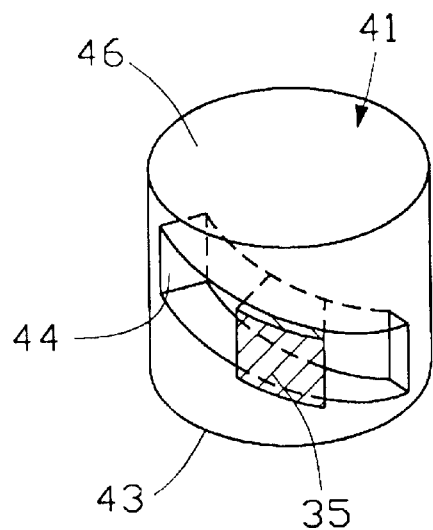
Figure 10C:
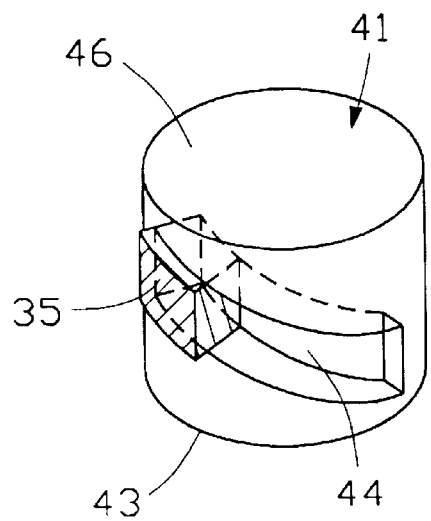

Referring to FIG. 2D, the actuator rod 3 comprises a follower body 31 connected to a rod 32 which is connected to a sliding end 33. The follower body 31 has a concave upper surface 34 on which a curved block 35 is formed. A hole 30 is defined in the follower body 31 for movably receiving the plug 114 (FIG. 2A). The follower body 31 is maintained by the plug 14 at a constant horizontal level and does not move pivotably with respect to the plug 14 due to retention from opposite parallel inner walls of the receptacle 115. The follower body 31 is dimensioned to be movable in the receptacle 115, wherein the openings 117, 118 allow a portion of the follower body 31 to move out of the receptacle 115 when the follower body 31 is moved to an end-most position substantially contacting a periphery of the opening 118. The rod 32 has staggered protrusions 321 formed on opposite sides along the lengthwise direction thereof, and each protrusion 321 has two tapered walls 320 formed on opposite sides thereof substantially along the lengthwise direction of the rod 32. The rod 32 is slidably received in the channels 1110, 1120 of the guiding channel means 11 and the reception space 25 of each second housing 2. Referring to FIG. 10, the protrusion 321 of the rod 32 will drive the protrusion 28 of the follower portion 21 of the second housing 2 to move along a direction D1 when the rod 32 moves along a direction D2, wherein the directions D1, D2 are substantially perpendicular to each other.

Figure 2E:
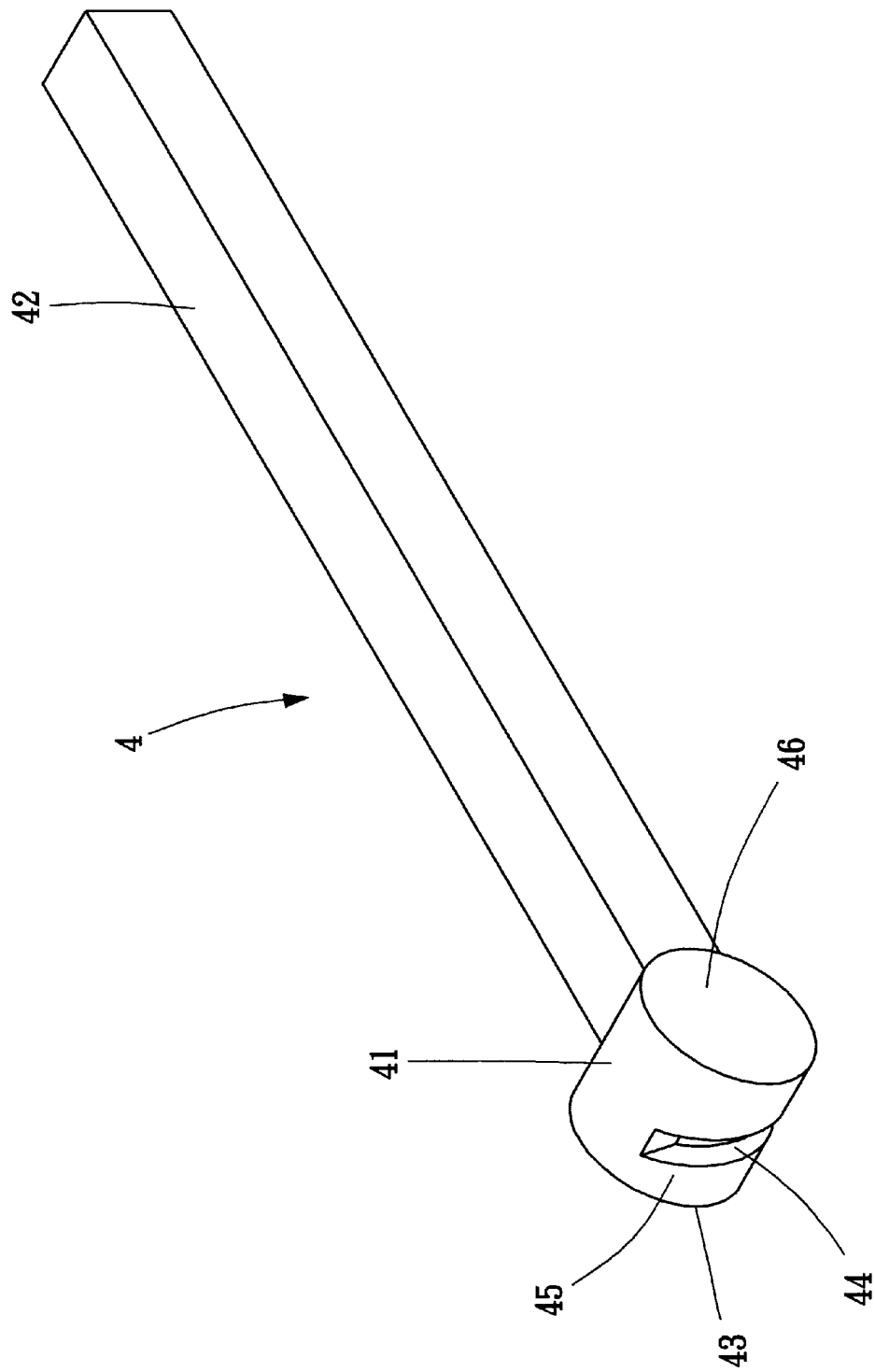
FIG. 2E is an enlarged perspective view of a cam lever of the ZIF PGA socket.

Referring to FIG. 2E, the cam lever 4 comprises a cam 41 and a handle bar 42 connected to the cam 41. The cam 41 is disk-shaped having opposite flat surfaces 42, 46 and a curved surface 45 which is substantially a circular surface connected between the flat surfaces 42, 46. An elongate recess 44 is defined in the curved surface 45 and opposite ends of the recess 44 are respectively proximate the flat surfaces 42, 46. Also referring to FIG. 2C, the cam 41 is dimensioned to be received in the reception space 115C of the receptacle 115 whereby the flat surfaces 42, 46 thereof are rotatably retained in the curved recesses 115D, i.e., the cam 41 is pivotably retained in the receptacle 115 of the guiding channel means 11.

Figure 11A:
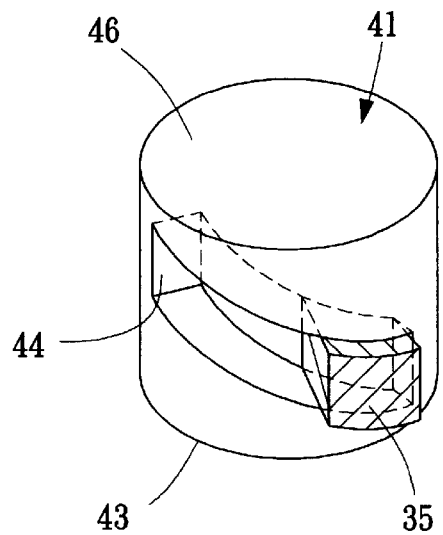
FIGS. 11A to 11C are schematic views showing the driving relationship between the cam lever and the actuator rod.
Figure 11B:
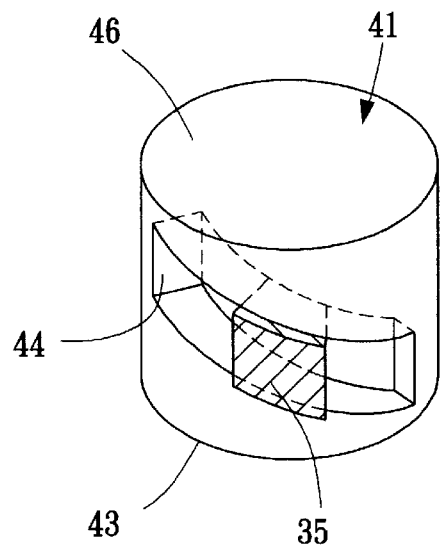
Figure 11C:
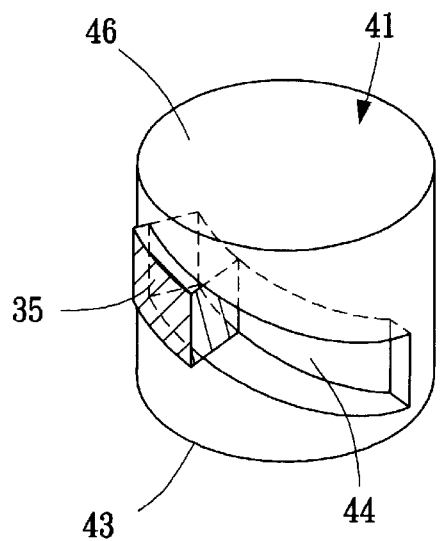

The elongate slanted recess 44 is adapted to be slidably engaged with the curved block 35 of the follower body 31 and the curved block 35 is retained in the elongate recess 44 when the cam 41 is rotated in the receptacle 115. The cam 41 drives the curved block 35 of the actuator rod 3 to move along a lengthwise direction of the actuator rod 3 when the handle bar 42 is manually rotated. FIGS. 11A, 11B and 11C illustrate the relative movement between the block 35 and the elongate recess 44, wherein the curved block 35 is driven by the cam 41 to move a distance along the axial direction of the cam 41 which is the same as the lengthwise direction of the actuator rod 3. Since the cam 41 is pivotable with respect to the receptacle 115 and the actuator rod 3 is movable within the guiding channel means 11, the relative movement of the curved block 35 with respect to the elongate recess 44 will cause a lateral movement of the block 35 along the axial direction of the cam 41.

Figure 3:
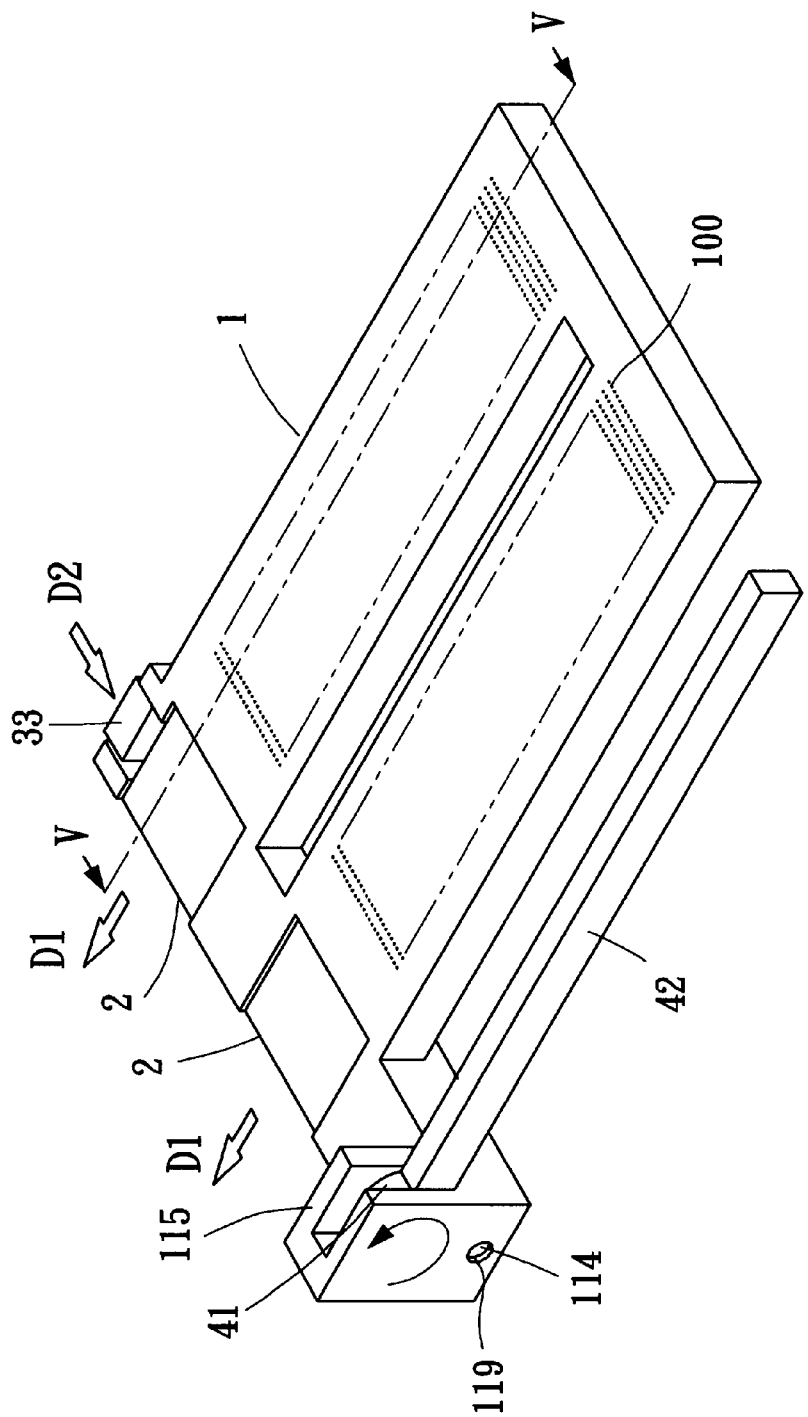
FIG. 3 is an assembled view of FIG. 1 showing the socket at a tightened status.
Figure 4:
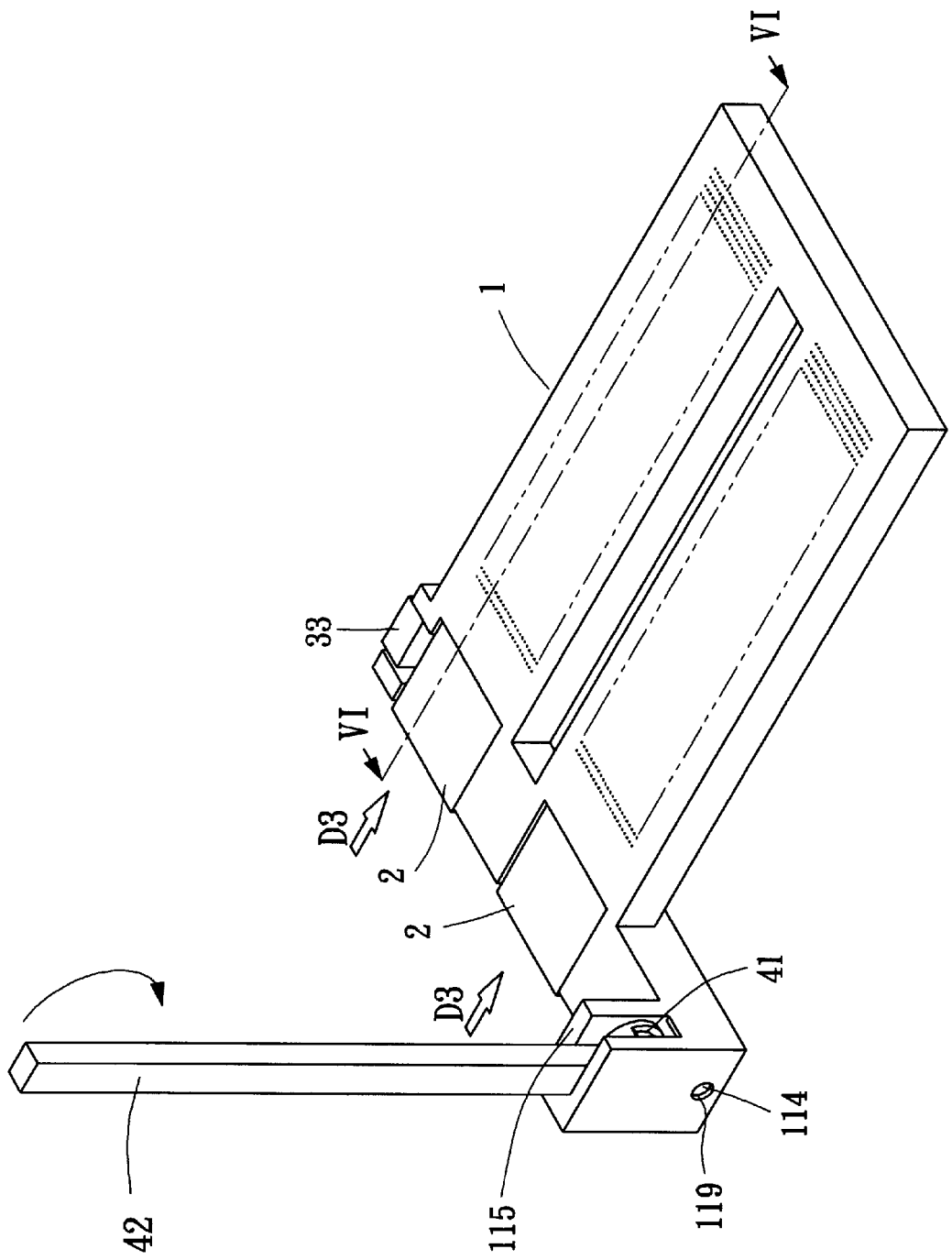
FIG. 4 is an assembled view of FIG. 1 showing the socket at a loosened status.

Referring to FIGS. 3 and 4, the cam 41 is pivotably retained in the receptacle 115, wherein the socket can be operated between a tightened status (FIG. 3) and a loosened status (FIG. 4) by pivoting the handle bar 42 with respect to the receptacle 115 (indicated by the curved arrow) for receiving a CPU module (not shown) with a substantially zero insertion force. Arrow D1 represents the direction of movement of the second housing 2 when changing from the tightened status to the loosened status, while arrow D2 represents the direction of movement of the sliding end 33 of the actuator rod 3. Both arrows D1, D2 are the same as those shown in FIG. 10. Similarly, arrow D3 represents the direction of movement of the second housing 2 when changing from the loosened status to the tightened status.

Figure 5:
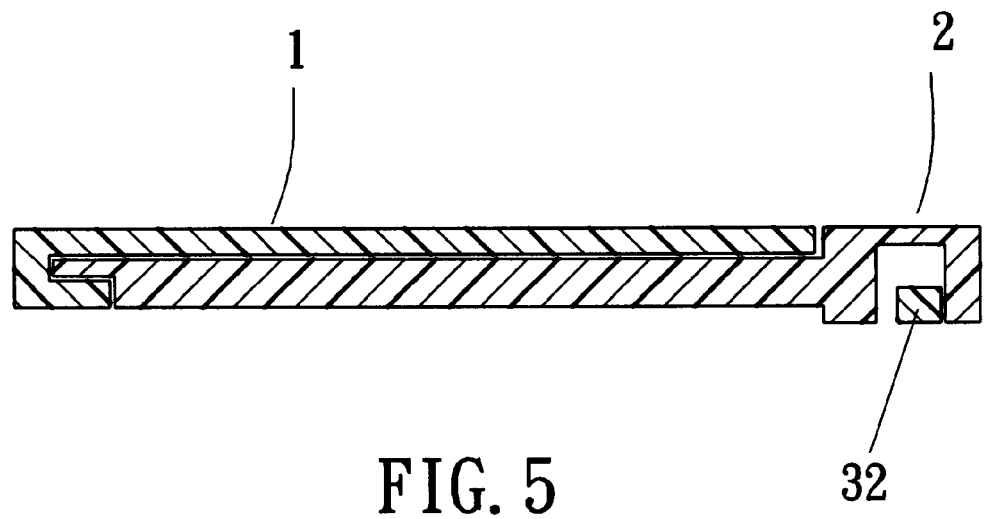
FIG. 5 is a cross-sectional view taken along line V—V of FIG. 3 showing the relationship between the second housing, the rod and the first housing.
Figure 6:
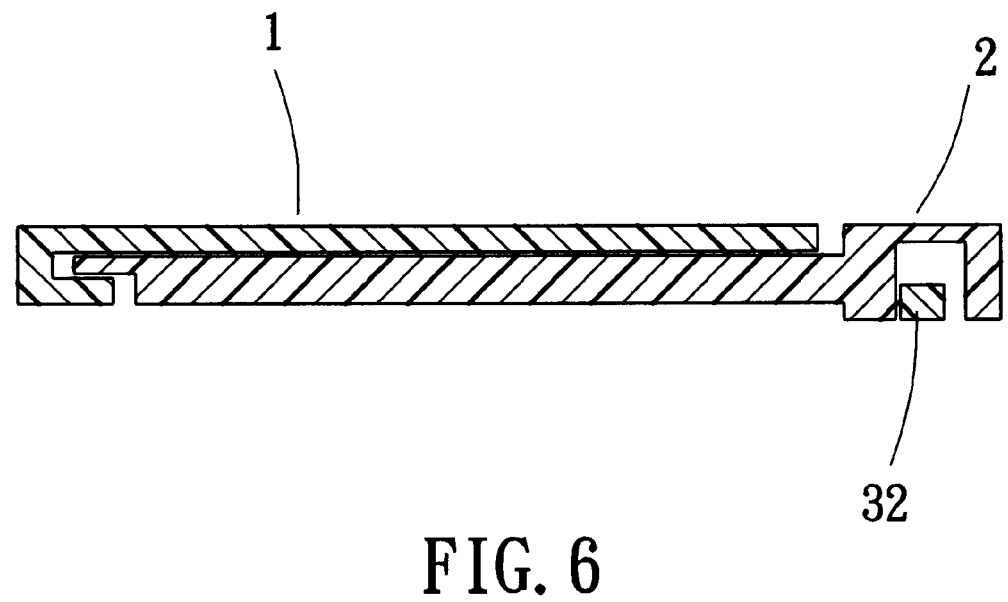
FIG. 6 is a cross-sectional view taken along line VI—VI of FIG. 4 showing the relationship between the second housing, the rod and the first housing.

Referring to FIGS. 5, 6 and 10, the second housing 2 is moved by the rod 32 and the distance of movement is substantially equal to the thickness of the protrusion 321 of the rod 32.

Figure 7A:
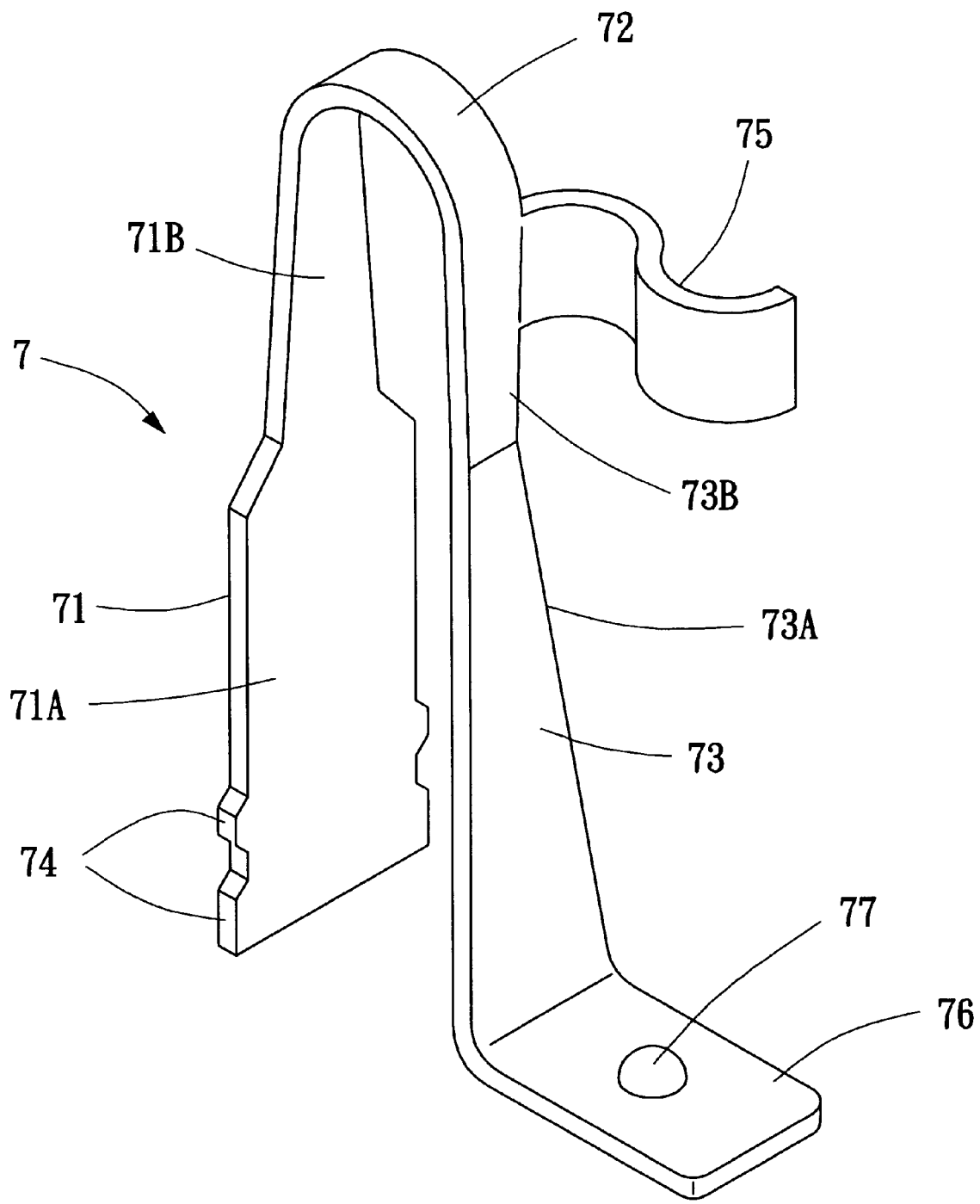
FIG. 7A is a perspective view of a contact used in the present invention.
Figure 9:
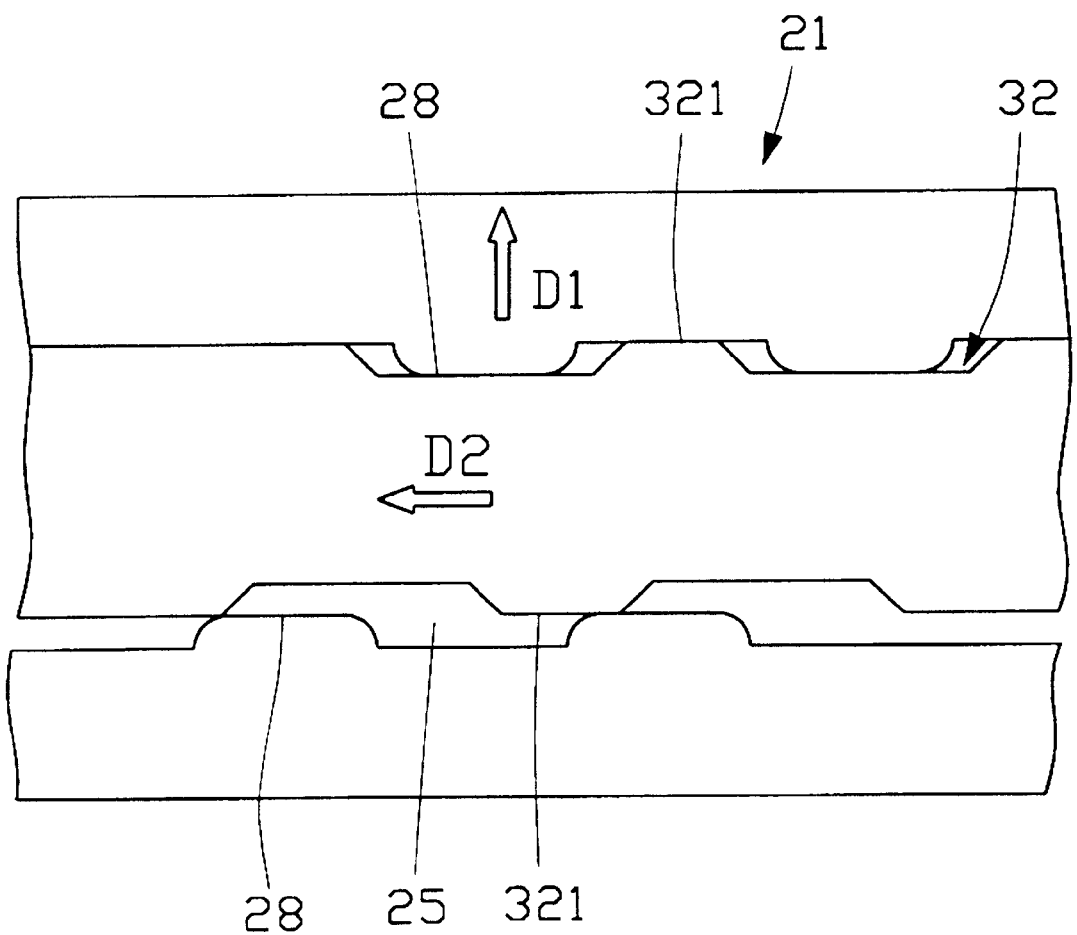
FIGS. 9A to 9C are schematic side views showing the relationship between the contact and a CPU pin.

Referring to FIG. 7A, the contact 7 of the present invention comprises an engagement section 71 connected to a curved section 72 which is connected to a compliant section 73. The engagement section 71 comprises a lower portion 71A and an upper portion 71B which is narrower than the lower portion 71A. The lower portion 71A forms barbs 74 on opposite sides thereof for interferentially engaging with opposite inner walls of the corresponding second passageway 200. An S-shaped contacting portion 75 extends from a junction between the curved section 72 and the compliant section 73 for contacting with a CPU pin 8 (FIG. 9C). The compliant section 73 comprises a lower portion 73A, an upper portion 73B, and a soldering tail 76 extending from one end of the lower portion 73A and forming a dimple 77 on a central portion thereof. A concave portion of the dimple 77 receives a solder ball 79 (FIG. 7B) used in ball grid array (BGA) soldering.

Figure 7B:
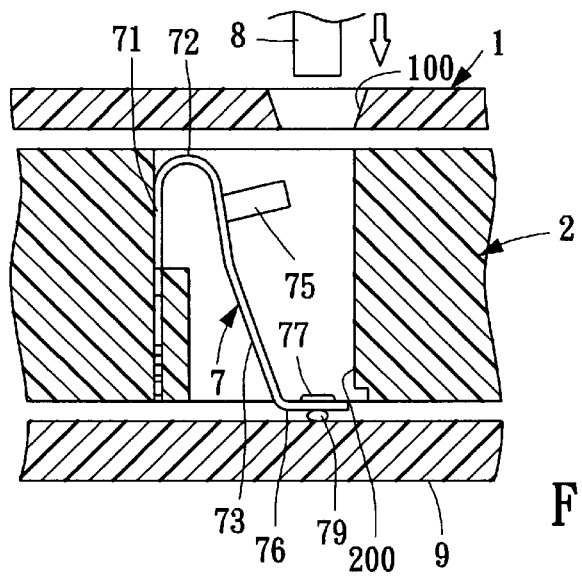
FIGS. 7B to 7D are schematic views showing the contact of FIG. 7A received in the second housing and deformed in accordance with the movement of the second housing.
Figure 7C:
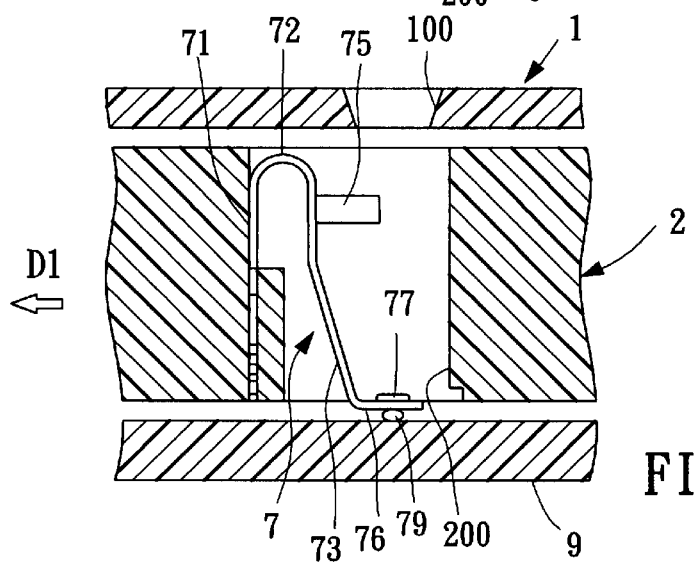
Figure 7D:
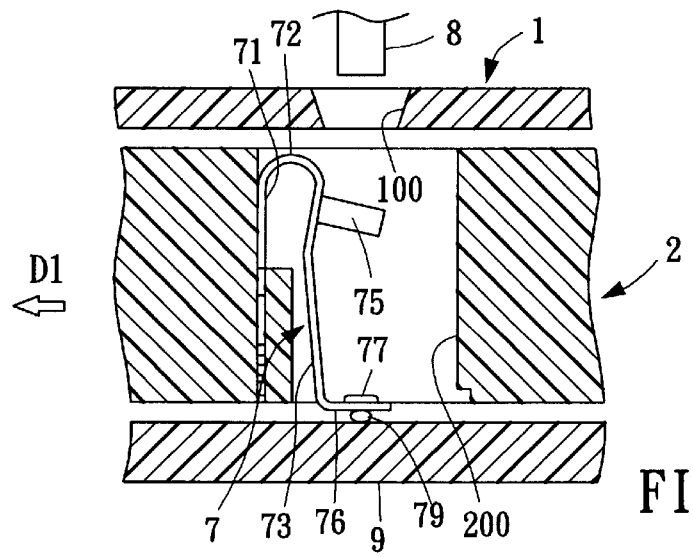

Referring to FIGS. 7B to 7D, each contact 7 is retained in the corresponding second passageway 200 of the second housing 2, whereby the barbs 74 thereof interferentially engage with opposite inner walls of the second passageway 200. A solder ball 79 is solderably attached to the concave side of the dimple 77 and is then soldered to a printed circuit board 9.

After the socket is fixed to the printed circuit board 9, the cam lever 4 is operated from the tightened status to the loosened status, and the relative position of the contact 7 with respect to the inner periphery of the second passageway 200 is changed from the position of FIG. 7D to the position of FIG. 7B. When the socket is operated from the tightened status to the loosened status, the contact 7 will experience a neutral status as shown in FIG. 7C, wherein the contact 7 substantially remains the same as it is in FIG. 7A, i.e., the contact 7 is subject to non-deformation at this moment. The arrow D1 shown in FIGS. 7D and 7C represents the direction of movement of the second housing 2 which is the same as that shown in FIG. 3. The first housing 1 and the printed circuit board 9 do not move from FIG. 7D through FIG. 7C to FIG. 7B. In FIG. 7D, the socket is at a tightened status whereby the contacting portion 75 of the contact 7 blocks an insertion path of a CPU pin 8, therefore the CPU pin 8 can not be inserted into the socket with zero insertion force. In FIG. 7B, the socket is at a loosened status whereby the contacting portion 75 of the contact 7 does not block the insertion path of the CPU pin 8, therefore the CPU pin 8 can be inserted into the socket with zero insertion force. The first passageway 100 is a tapered hole for facilitating insertion of the CPU pin 8 thereinto.

The contact 7 is subject to deformation during both the tightened status and the loosened status, i.e., the contact 7 is subject to stress during both status's. When the socket is at the loosened status as shown in FIG. 7B, the stress levels of different parts of the contact 7 are different. For example, stress levels from high to low according to a finite element analysis are in the following sequence: the junction between the compliant section 73 and the soldering tail 76, the curved section 72 (including the junctions respectively formed between the compliant section 73 and the engagement section 71), the lower portion 73A of the compliant section 73, the upper portion 73B of the compliant section 73, and the soldering tail 76. Compared to the other portions listed above, the soldering tail 76 receives a relatively small amount of stress, thus, the soldering effect may be maintained. Moreover, the problem due to different coefficients of thermal expansion between the second housing 2 and the printed circuit board 9 may also be effectively resolved by the specific structure of the contact 7.

Figure 8A:
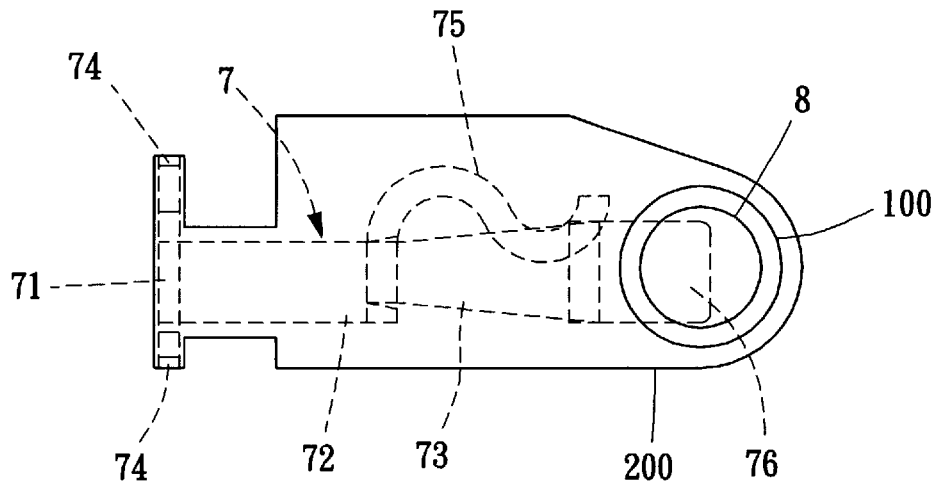
FIGS. 8A to 8C are schematic top views showing the relationship between the contact and a CPU pin.
Figure 8B:
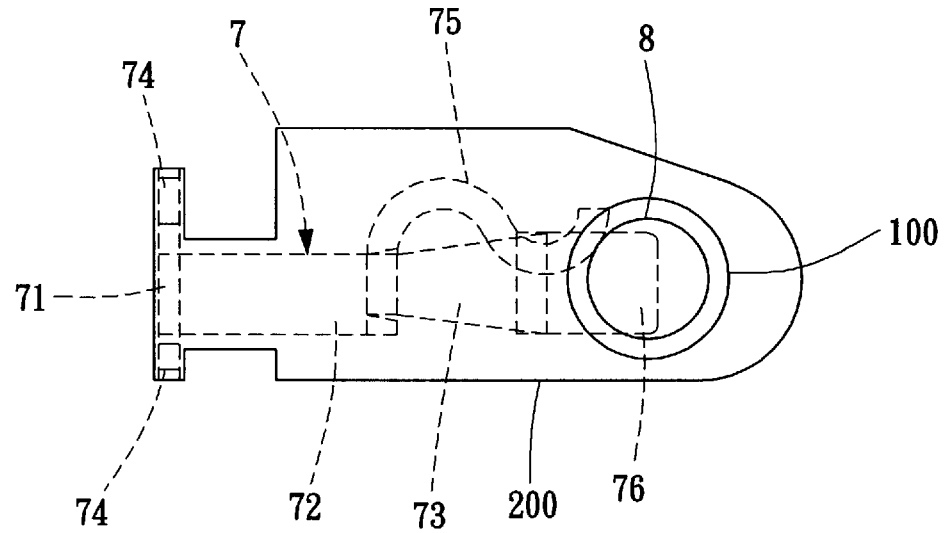
Figure 8C:
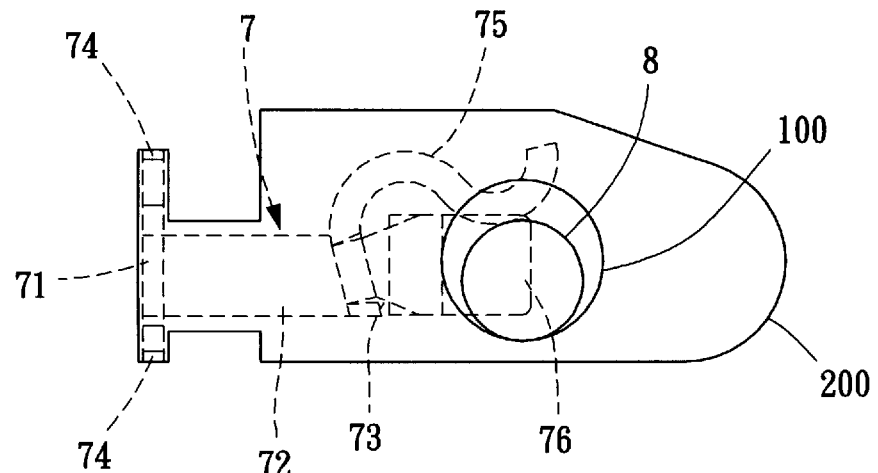

FIGS. 8A to 8C and 9A to 9C illustrate that the CPU pin 8 extending from a CPU or a CPU module (not shown) is partially received in the first passageway 100 of the first housing 1 and the second passageway 200 of the second housing 2, wherein FIGS. 8A and 9A correspond with FIG. 7B. The CPU (or CPU module) rests on the first housing 100 and substantially remains stationary when the second housing 2 is moved by the rod 32 from a first relative position shown in FIG. 9A to a second relative position shown in FIG. 9C. Referring to FIGS. 8B and 9B, the contact 7 is moved by the second housing 2 along the direction D3 and approaches the CPU pin 8. Referring to FIGS. 8C and 9C, the contact 7 is continuously moved by the second housing 2 along the direction D3 to substantially contact the CPU pin 8 and is deformed thereby. Particularly referring to FIG. 8C, the CPU pin 8 is biased by the contacting portion 75 of the contact 7 due to a normal force therefrom thereby guaranteeing electrical connection therebetween.

When the socket is at the tightened status as shown in FIGS. 8C and 9C, the stress levels of different parts of the contact 7 are different. For example, stress levels from high to low according to a finite element analysis are in the following sequence: the junction between the upper portion 73B of the compliant section 73 and the contacting portion 75, the junction between the upper portion 71B of the engagement section 71 and the curved section 72, the junction between the compliant section 73 and the soldering tail 76, the junction between the upper and lower portions 73A, 73B of the compliant section 73, the curved section 72, the upper portion 73B of the compliant section 73, the lower portion 73A of the compliant section 73, the contacting portion 75, and the soldering tail 76. Compared to the other portions, the soldering tail 76 receives a relatively small amount of stress, therefore, the soldering effect may be maintained during the tightened status.

It should be noted the feature of the invention is to provide a two-piece design. i.e., the rotatable cam and the slidable actuator rod, instead of the conventional one piece integrally formed lever-cam structure for compliance with the low profile requirement thereof. It is because the cam structure in the conventional design is too high along its cross-section and can not meet the requirement, while the flat actuator rod can. Thus, the invention is to provide a rotation combining sliding actuation of the actuation device in place of the conventional pure rotation actuation.

While the present invention has been described with reference to a specific embodiment relating to the cam lever, the housing structure, the actuator rod, and the contact, the description is illustrative of the invention and is not to be construed as limiting the invention.

Therefore, various modifications to the present invention can be made to the preferred embodiment by those skilled in the art without departing from the true spirit and scope of the invention as defined by the appended claims.

What is claimed is:

1. A driving mechanism for a ZIF PGA socket which comprises a main housing slidably receiving two second housings therein, the driving mechanism comprising:
    a cam lever comprising a cam and a handle bar connected to the cam, the cam being disk-shaped having opposite flat surfaces and a curved surface connected between the flat surfaces and defining an elongate recess therein;
    an actuator rod comprising a follower body connected to a rod which is movably engaged with the two second housings, the follower body having a concave upper surface on which a curved block is formed to be slidably received in the elongate recess of the cam;
    whereby when the cam lever is rotated, the curved block of the actuator rod is moved along the elongate recess thus causing the rod to move in a direction parallel to an axial direction of the disk-shaped cam.

2. The driving mechanism as claimed in claim 1, wherein the rod has staggered protrusions formed on opposite sides along the lengthwise direction thereof.

3. The driving mechanism as claimed in claim 2, wherein the each protrusion of the rod has two tapered walls formed on opposite sides thereof substantially along the lengthwise direction of the rod.

4. A ZIF PGA socket comprising
    a first housing defining two recesses for slidably receiving two second housings therein and comprising guiding channel means external to the recesses and comprising a receptacle;
    a follower portion extending from the second housing external to the recess of the first housing and aligning with the guiding channel means;
    a cam lever comprising a cam and a handle bar connected to the cam, the cam being disk-shaped having opposite flat surfaces and a curved surface connected between the flat surfaces and defining an elongate recess therein, the cam being rotatably received in the receptacle of the guiding channel means;
    an actuator rod comprising a follower body connected to a rod which is movably engaged with the two second housings, the follower body being movably received in the receptacle and having a concave upper surface on which a curved block is formed to be slidably received in the elongate recess of the cam;
    whereby when the cam is rotated by the handle bar, the curved block of the actuator rod is moved along the elongate recess thus causing the rod to move in a direction parallel to an axial direction of the disk-shaped cam.

5. The ZIF PGA socket as claimed in claim 4, wherein the receptacle defines curved recesses in opposite inner walls thereof for pivotably retaining the cam.

6. The ZIF PGA socket as claimed in claim 5, wherein the follower portion of the second housing is a U-shaped member having two parallel walls facing each other, each wall having first protrusions extending therefrom, the first protrusions in opposite walls being staggered with each other.

7. The ZIF PGA socket as claimed in claim 6, wherein each first protrusion forms two tapered walls on opposite sides thereof along the lengthwise direction of the guiding channel means.

8. The ZIF PGA socket as claimed in claim 7, wherein the actuator rod forms staggered second protrusions on opposite sides along the lengthwise direction thereof, each second protrusion forming tapered walls on opposite ends thereof along the lengthwise direction of the guiding channel means.

9. The ZIF PGA socket as claimed in claim 8, wherein the second housing is moved in a direction perpendicular to the lengthwise direction of the actuator rod when the tapered wall of the second protrusion slides over the corresponding tapered wall of the first protrusion.

10. The ZIF PGA socket as claimed in claim 9, wherein the follower body of the actuator rod and the receptacle of the guiding channel means each define a hole aligned with each other and linked by a plug.

11. A socket comprising:
    a stationary first housing and a moveable second housing;
    a driving mechanism for actuating the second housing to move regard to the first housing, including:
    a cam lever rotatably moved with regard to the first housing, and an actuator rod slidable moved with regard to the first housing for engagably actuating the second housing; and
    means for linking said cam lever and said actuator rod together.

12. The socket as claimed in claim 11, wherein said means includes an elongated slanted recess formed in the cam and a block formed on the actuator rod engagably and slidably received within said recess.

13. A socket comprising:
    a stationary first housing and a moveable second housing;
    a driving mechanism including at least an actuator rod; and
    means for actuating the second housing to move in a first direction perpendicular to a second direction along which the actuator rod is moved.

14. The socket as claimed in claim 13, wherein said means includes protrusions respectively formed on the actuator rod and the second housing.

15. The socket as claimed in claim 14, wherein said protrusions form tapered walls thereon.

16. A method for interconnecting a CPU to a printed circuit board, comprising the steps of:
    providing a socket on said printed circuit board, said socket including a stationary first housing and a slidable second housing wherein said first housing defines a plurality of first passageways therein and said second housing defines a plurality of second passageways therein in alignment with the corresponding first passageways, respectively;
    depositing a plurality of contacts within the corresponding second passageways, respectively, and soldering to the printed circuit board thereunder;
    providing a driving mechanism including at least an actuator rod on the socket;
    positioning the CPU on a top of the socket wherein a plurality of CPU pins extend through the first passageways and into the corresponding aligned second passageways, respectively; and providing means for engagement between the actuator rod and the second housing; wherein when the actuator rod is linearly moved along a first direction, the second housing is correspondingly linearly moved, through said means, along a second direction so as to have the CPU pins mechanically and electrically engage the corresponding contacts.

17. The method as claimed in claim 16, wherein said first direction is perpendicular to said second direction.

18. The method as claimed in claim 16, further including an additional step of providing a rotatable lever cam linked to said actuator rod so that said actuator rod can be linearly moved by rotating the lever cam, thus resulting in a rotation/sliding actuation thereof.

* * * * *